United States Patent [19]

Wheatley, Jr.

[11] 3,886,466

[45] May 27, 1975

[54] BIAS CIRCUITRY FOR STACKED TRANSISTOR POWER AMPLIFIER STAGES

[75] Inventor: Carl Franklin Wheatley, Jr., Somerset, N.J.

[73] Assignee: RCA Corporation, New York, N.Y.

[22] Filed: May 24, 1973

[21] Appl. No.: 363,562

[52] U.S. Cl. ...................... 330/15; 330/17; 330/18; 330/19; 30/22; 330/23; 330/28; 330/30 D

[51] Int. Cl. .............................................. H03f 3/26

[58] Field of Search ............ 330/15, 17, 18, 19, 22, 330/28, 38 M, 40

[56] References Cited

UNITED STATES PATENTS 3,668,541 6/1972 Pease .................................... 330/23

*Primary Examiner*—R. V. Rolinec
*Assistant Examiner*—Lawrence J. Dahl
*Attorney, Agent, or Firm*—H. Christoffersen; S. Cohen

[57] ABSTRACT

Stacked transistor power amplifier stages in an integrated-circuit quasi-linear amplifier are supplied quiescent bias currents which vary in inverse proportion to their forward current gains. This causes their quiescent collector currents to be at sufficiently low levels to reduce to low values both distortion and quiescent power dissipation.

18 Claims, 3 Drawing Figures

BIAS CIRCUITRY FOR STACKED TRANSISTOR POWER AMPLIFIER STAGES

Figure 1:
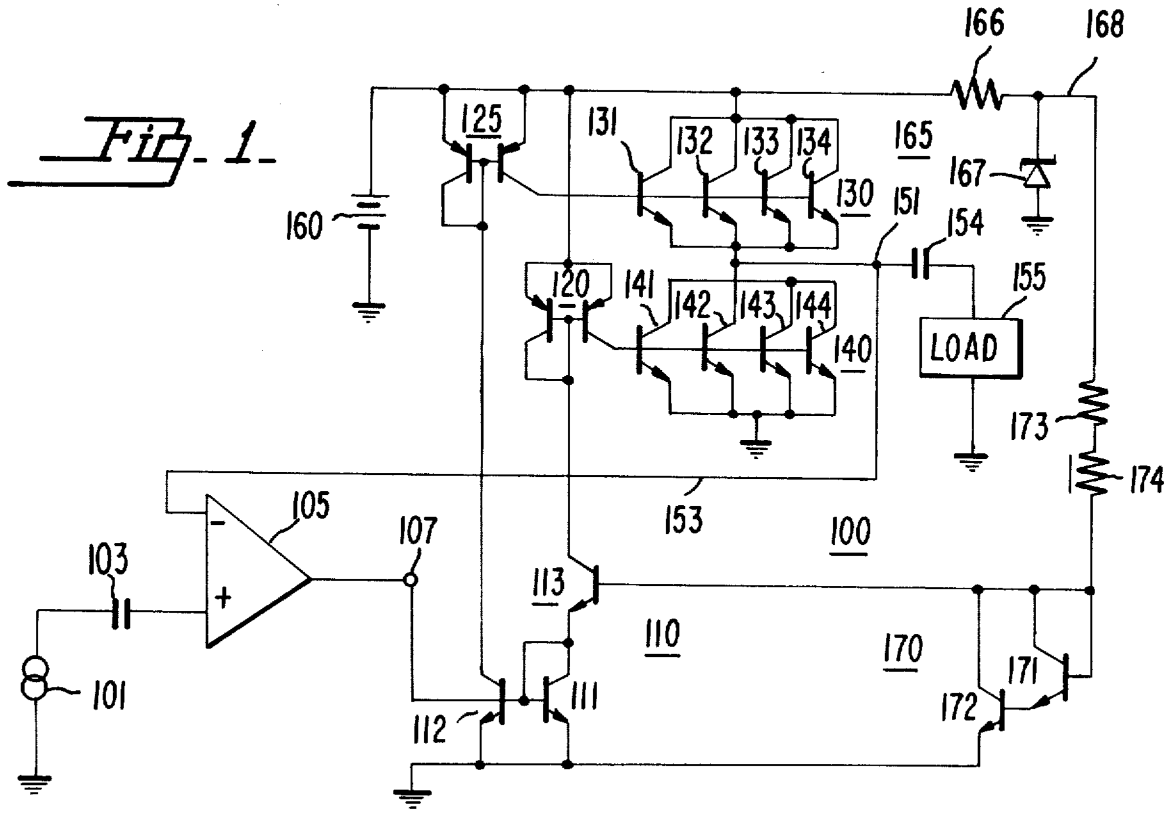

The present invention relates to the biasing of stacked transistor power amplifier stages and particularly to the biasing of class B audio power amplifiers constructed in integrated circuit form.

The term "stacked amplifier stages" refers to amplifiers in which the output circuits of the amplifier stages are serially connected for quiescent flow. These output circuits are normally operated in push-pull insofar as signal is concerned. The term "quasi-linear" amplifier refers to an amplifier in which the output signal is linearly related to the input signal, but in which the individual stages are operated non-linearly. The individual stages in a quasi-linear amplifier typically are operated Class B or Class AB.

The term "cross-over distortion" refers to a condition in which the output signal of a quasi-linear amplifier departs from a linear relationship with its input signal because of the input signal causing one of the individual stages to cease conduction while at the same time not causing another of the individual stages to begin conduction.

"Voltage-mode biasing" refers to supplying determinate base-emitter potential to a transistor from a relatively low impedance source to establish its operating currents. "Current mode biasing" refers to supplying determinate base current to a transistor from a relatively high impedance source to establish its operating currents.

The conventional manner in which stacked Class B amplifier stages employing transistors connected in common-emitter amplifier configurations are biased is by the application of temperature-dependent potentials from a low-impedance source to each of their base-emitter junctions. The low-impedance sources used for this voltage-mode biasing technique are generally provided by forward-biased diodes or diodde-connected transistors. Substantially similar and substantially constant quiescent collector currents can be provided in each of the common-emitter amplifier output stages despite variations of temperature and operating supply potential. This quiescent current flow through the stages avoids cross-over distortion, but is normally maintained as low as possible consistent with avoiding cross-over distortion. This is done to keep quiescent dissipation in the output stages as low as possible and thus help minimize the likelihood of thermal runaway of the output transistors.

The use of this conventional technique to bias Class B amplifier stages was found to be somewhat less than satisfactory in integrated circuitry. It was difficult to get the quiescent collector currents in the output amplifier stages to match each other well and for both of them to be maintained at that level just sufficiently large to keep cross-over distortion acceptably low. The inventor perceived that the problem was caused by the substantially large thermal gradients in the integrated circuit, interfering with the proper matching of the output transistors with each other and with their low-impedance sources of base-emitter bias potential.

For each degree Kelvin of temperature change, the collector current of a silicon transistor changes 8 to 9% if its base-emitter potential is fixed and, alternatively, only 0.7% if its base current is fixed. The inventor noticed that this latter condition, which was less temperature sensitive than the former condition conventionally imposed, approximated the desired condition of holding the quiescent collector currents of the output transistors at a constant level to avoid crossover distortion while minimizing their internal dissipation. Biasing the base electrodes of the output transistor of an integrated circuit Class B amplifier with temperature-compensated quiescent currents from high impedance sources in order to achieve constant quiescent collector currents in these transistors was perceived as the best way to overcome the severe problem of matching their conductance characteristics despite thermal gradient variations within the integrated circuit.

As known (for instance, from the article "HIGH IMPEDANCE DRIVE FOR THE ELIMINATION OF CROSSOVER DISTORTION," Faran and Fulks, *THE SOLID STATE JOURNAL*, August 1961, pp. 36–40) there are desirable features associated with applying input currents to Class B amplifier output transistors from high-impedance sources rather than input voltages from low-impedance sources. A transistor exhibits less pronounced non-linearity in its common-emitter forward current gain (variously denominated as "beta," "$\beta$," or "$h_{fe}$") as its conduction is reduced, than in its transconductance ($g_m$). Therefore, there is an inherent tendency for the transistor to operate more linearly as an amplifier of input currents than as an amplifier of input voltages.

Current mode biasing is used when the transistor is supplied input signal from high-impedance source to avoid the attenuation of input signal which voltage-mode biasing causes when the impedance of the source providing input signals is not low.

It is simple to add signal currents to the quiescent base bias currents of power amplifier output transistors when using current-mode biasing without interfering with the stablizing of the operating points of the transistors to forestall thermal runaway. It is a more difficult task to add signal voltages to the temperature-stabilizing bias potentials applied at low impedance level to the base-emitter junctions of the power amplifier transistors when voltage-mode biasing is used and at the same time avoid incurring an unacceptably high risk of thermal runaway. As pointed out in the cited article, rapid heating of the output transistors during signal excursions can reduce their base-emitter offset potentials so fast that the regulation of the temperature-compensating network cannot follow to provide the required reduction of applied bias potential to avoid thermal runaway.

Driving common-emitter transistor amplifier stages from high-impedance sources and applying current mode biasing to these stages has never found widespread favor. In substantial part this is because in order to obtain symmetrical operation, the transistors in push-pull Class B amplifier stages would have to have better matched betas when operated in this manner than when they are driven from low impedance sources and have voltage mode biasing applied to them. The inventor observed that this objection has little validity in integrated circuits since the transistors by virtue of being fabricated simultaneously by the same sequence of processing steps have closely similar current gains. The inventor observed that the common-emitter forward current gain of a silicon transistor for the condition of constant collector current being imposed had only an 0.7% change per degree Centigrade of temperature change. This meant the use of current-mode biasing of Class B amplifier stages in an integrated circuit should be substantially less affected by thermal gradients appearing within the integrated circuit than conventional voltage mode biasing, which has proven to be the case.

Even when operating the Class B amplifier stage transistors to amplify input currents rather than input voltages, it is advantageous to reduce crossover distortion by means of a small quiescent collector current flow through them rather than by relying upon negative feedback. The inventor realized that this precluded the use of the prior art technique of current-mode biasing Class B amplifier stages with fixed value base currents. With such biasing, the collector currents of the outputs transistors, vary as a linear function of their betas. So, accordingly, does the quiescent dissipation of these transistors. Betas of integrated circuit transistors can vary over a wide range from one production run to another due to process variations, and this results in an unacceptably large quiescent dissipation in at least a portion of the total manufacture. Also, beta exhibits percentage changes with temperature, as has been noted. Selection of transistors had been used to solve the problem of beta variation in discrete circuity. Selection is an unacceptably expensive solution for integrated circuits since there is no use for the rejected integrated circuits.

In a stacked-transistor power amplifier constructed in accordance with the present invention the output transistors have quiescent base currents applied to them which vary inversely proportionally to their beta, whereby their quiescent collector currents are defined in a substantially beta-independent manner. This permits the output transistors to be biased at a level just sufficient to avoid crossover distortion despite beta variations caused by temperature change and processing variations in device manufacture.

The phase-splitting amplifier as may be used to develop Class B push-pull signals for application to the output transistor amplifier stages is, in a further aspect of the present invention, used in applying beta-dependent quiescent base currents to the output transistor amplifier stages.

Figure 2:
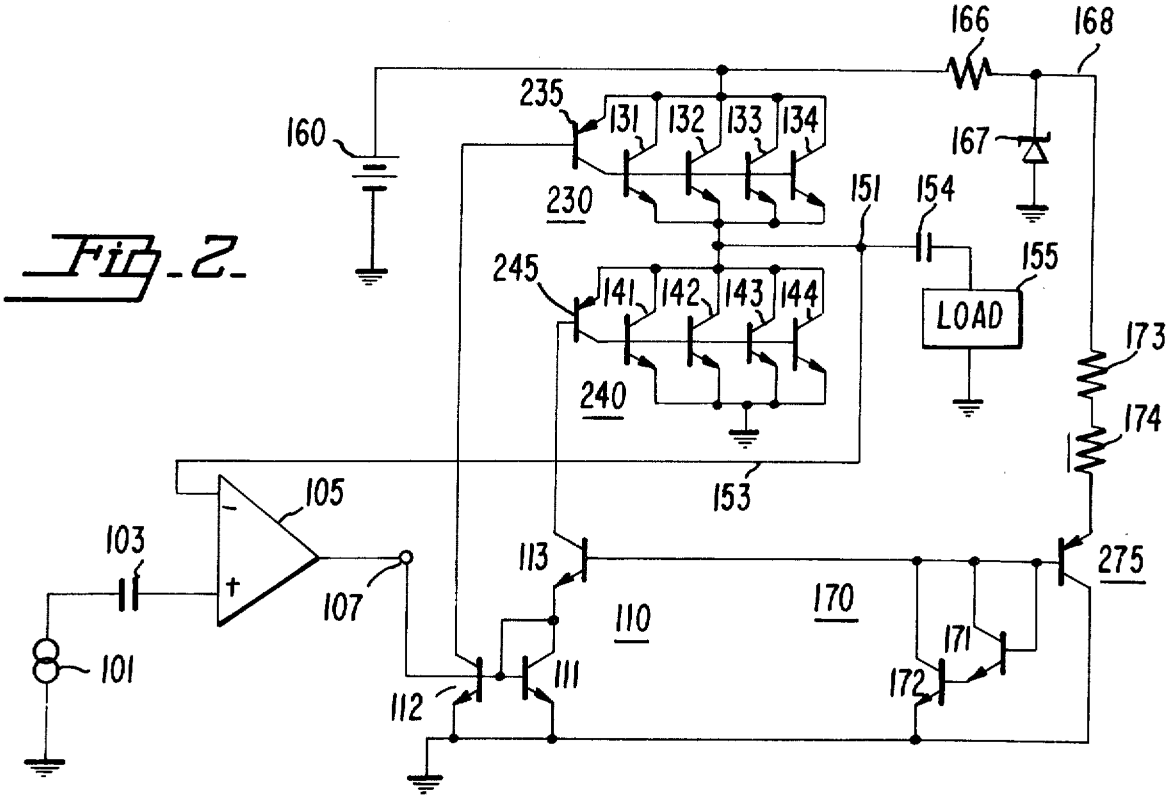
Figure 3:
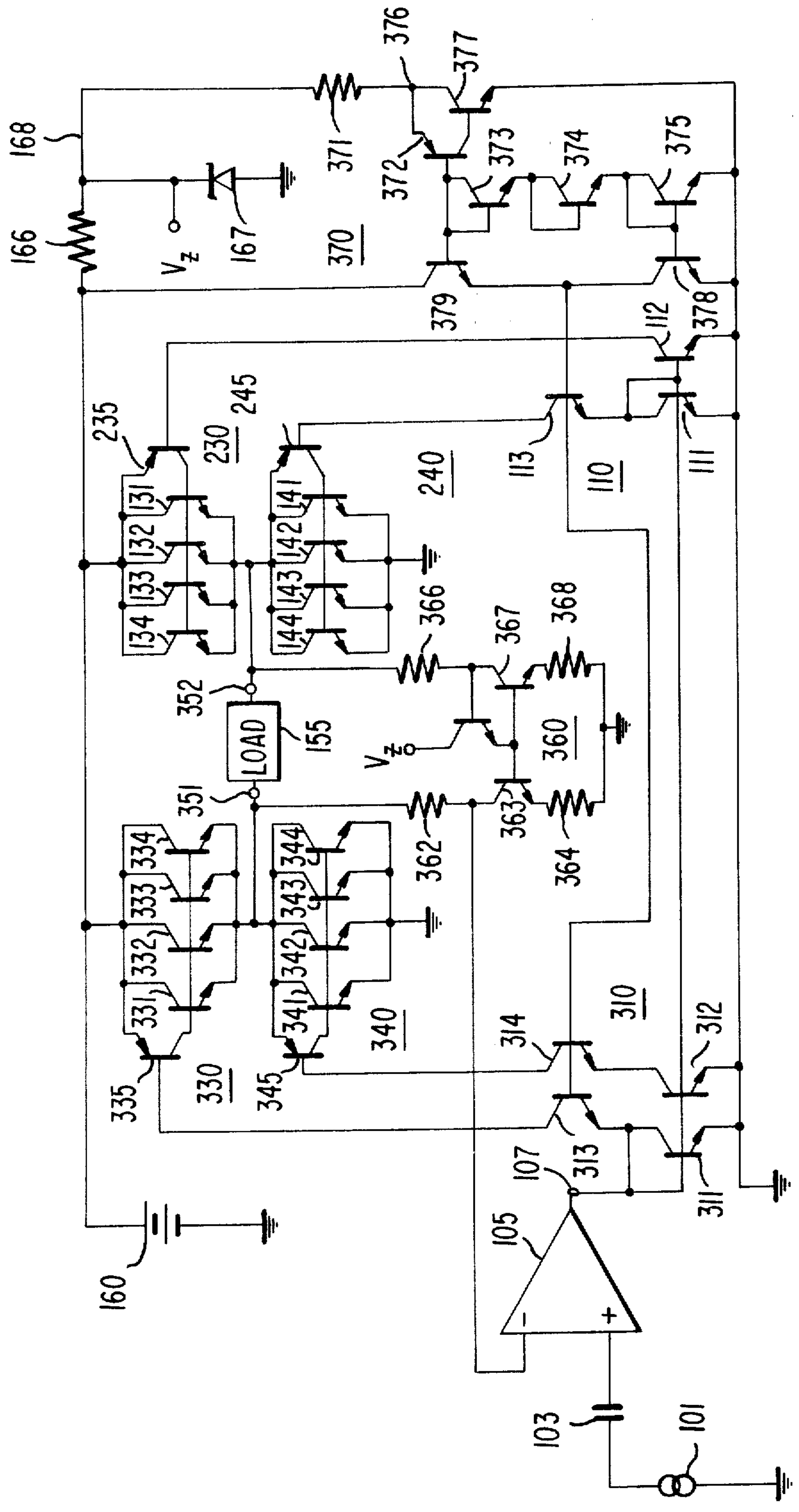

The present invention will be better understood from the following detailed description and from the drawing in which:

FIG. 1 is a schematic diagram of an amplifier embodying the present invention, showing the use of resistors sensitive to temperature and transistor beta variations to provide current mode biasing for stacked NPN power transistors;

FIG. 2 is a schematic diagram of an amplifier embodying the present invention showing the use of resistors sensitive to temperature and transistor beta variations to provide current-mode biasing for stacked composite PNP power transistors, and FIG. 3 is a schematic diagram of an amplifier embodying the present invention showing the use of temperature measuring transistors to provide current-mode biasing for composite-PNP power transistors, two stacked composite-PNP power transistor configurations being connected as a bridge amplifier.

FIG. 1 shows an audio amplifier 100 the parts of which, except for elements 101, 103, 154, 155 and 160, are assumed to be constructed in integrated circuit form. Input signal potential supplied from source 101 is coupled via capacitor 103 to a pre-amplifier circuit 105 which develops signal current proportional to the input signal potential. This current is coupled to a node 107 at the input of a phase-splitter circuit 110 comprising transistors 111, 112, 113 of the sort described in U.S. Pat. No. 3,573,645 entitled "PHASE-SPLITTING AMPLIFIER;" issued Apr. 6, 1971, in the name of Carl Franklin Wheatley, Jr. and assigned to RCA Corporation. The push-pull collector currents of transistors 112, 113 are applied as input signals respectively to the current mirror amplifiers 125, 120. The current mirror amplifiers 125, 120 invert the push-pull collector currents of transistors 112, 113 respectively, for application to the respective base electrodes of composite-PNP output transistors 130, 140.

The composite output transistors 130, 140 are each shown as comprising a plurality of parallelly connected transistors 131, 132, 133, 134 and 141, 142, 143, 144, respectively, but may alternatively each be replaced by a single large-area device. Transistors 130 and 140 are shown as composite transistors to suggest the fact that their current handling capabilities are generally substantially greater than those of the other transistors shown. Responsive to the push-pull signal currents applied to their base electrodes, the transistors 130 and 140 provide an output current to node 151 substantially proportional to input signal potentials applied from source 101. A negative feedback connection 153 may, as shown, be made from the node 151 to the pre-amplifier 105 to provide overall degenerative feedback for the amplifier 100. The output current provided to node 151 is applied via capacitor 154 to an output load 155.

The means of providing quiescent bias for transistors 130, 140 is of special interest insofar as the present invention is concerned. Assuming the primary source 160 of energizing potential for the circuit to be unregulated, a regulator 165 (comprising, for example, a series resistor 166, and a shunt avalanche diode 167) is used to obtain a regulated voltage at node 168. The Darlington diode connection 170 of similar-geometry transistors 171, 172 regulates the potential at the collector electrodes of transistors 171, 172 to be the sum of the offset potentials across their base-emitter junctions, a potential which is substantially constant. Accordingly, the potential across serially connected resistors 173, 174 is substantially constant.

The resistor 173 is formed by simple diffusion together with the base regions of transistors within the amplifier 100, and its resistance is independent of the forward current gains (betas) of the transistors with which it is integrated. The resistor 174 is formed as a "pinch" resistor by a first diffusion along with the base regions of transistors within the amplifier 100 and a second diffusion along with their emitter regions. (A pinch resistor is indicated in the Figures by the conventional resistor symbol accompanied by a bar to distinguish it more readily from resistors formed by a single diffusion.) Consequently, the resistance of resistor 174 varies proportionally with the betas of the NPN transistors. The nominal resistances of resistors 173 and 174 are made alike. The substantially constant voltage impressed across their combined resistances causes a current flow therethrough which exhibits a percentage change with beta variation one half so great as the percentage change in beta itself. Accordingly, a quiescent current varying proportionally with $\beta_{NPN}^{-1/2}$ is supplied to the joined collectors of transistors 171, 172, where $\beta_{NPN}$ is the common-emitter forward current gain of an NPN transistor.

Since the collector current of transistor 171 is smaller than that of transistor 172 by a factor substantially equal to its common-emitter forward current gain, $\beta_{NPN}$, its base-emitter offset voltage is smaller than that of transistor 172 by an amount definable substantially as:

$$\Delta V_{BE} = (kT/q) \ln \beta_{NPN} \quad (1)$$

where:
$k$ = Boltzmann's constant,
$T$ = absolute temperature, and
$q$ = the charge on an electron This follows from the basic equation defining transistor action:

$$V_{BE} = (kT/q) \ln (I_C/I_S) \quad (2)$$

in which:
$V_{BE}$ = the base emitter potential offset of the transistor,
$I_C$ = its collector current, and
$I_S$ = its saturation current.

For a first and a second transistor, $Q_1$ and $Q_2$, $$(V_{BE}) Q_1 = (kT_{Q_1}/q) \ln [(I_C)_{Q_1}/(I_S)_{Q_1}] \quad (3)$$

$$(V_{BE}) Q_2 = (kT_{Q_2}/q) \ln [(I_C)_{Q_2}/(I_S)_{Q_2}] \quad (4)$$

The temperatures $T_{Q_1}$ and $T_{Q_2}$ of transistors $Q_1$ and $Q_2$ respectively, are substantially the same as the temperature $T$ if the transistors are in proximity within the same integrated circuit. If the transistors $Q_1$ and $Q_2$ are formed by the same diffusion processes within the chip and have similar base-emitter junction areas, then their saturation currents $(I_S)_{Q_1}$ and $(I_S)_{Q_2}$ will be substantially equal. Subtracting $V_{BEQ_2}$ from $V_{BEQ_1}$ yields $\Delta V_{BE}$, which is a function of the ratio of the collector current $(I_C)_{Q_1}$ and $(I_C)_{Q_2}$ of transistors $Q_1$ and $Q_2$, respectively. That is:

$$\Delta V_{BE} = (kT/q) \ln [(I_C)_{Q_1}/(I_C)_{Q_2}] \quad (5)$$

The emitter current of transistor 171 is, except for a negligibly small base current, equal to its collector current. The emitter current of transistor 171 is the base current of transistor 172, and the collector current of transistor 172 is larger than this base current by its common-emitter forward current gain $\beta_{NPN}$. Therefore:

$$[(I_C)_{Q_1}/(I_C)_{Q_2}] = \beta_{NPN} - 1 \quad (6)$$

where $Q_1$ and $Q_2$ are transistors 172 and 171, respectively. Substituting from equation 6 into equation 5, equation 1 is obtained.

One half of the $\Delta V_{BE}$ between the $V_{BE}$'s of transistors 171 and 172 defined per equation 1 as impressed across the serially connected base-emitter junctions of transistors 111, 113 must appear across each of them. (Since substantially the same current flows through the serially connected collector-to-emitter paths of transistors 111, 113, the base-emitter potentials to support these substantially equal currents must be substantially equal to each other.) Presuming the similar geometry transistors 111, 112, 113 to have the same geometry as transistors 171, 172, the collector currents of transistors 111, 112, 113 will be related to that of transistor 172 substantially in the ratio 1: $\beta_{NPN}^{-1/2}$, as follows from equation 5.

(While the $2V_{BE}$ potential developed between the collector and emitter electrodes of transistor 172 is small enough that the transistors 111, 112, 113 are barely biased into conduction, the current flow into the Darlington diode configuration 170 is substantially larger than the base current of transistor 113 even on negative peaks of the signal applied to terminal 107. The low source impedance of the Darlington diode configuration 170 insofar as supplying base potential is thus preserved for all input signal conditions.)

Since the collector current of transistor 172 (the dominant current in the current drawn by the Darlington configuration 170 through the serially connected resistors 173, 174) is related by a $\beta_{NPN}^{-1/2}$ factor to the potential across the resistors, the collector currents of transistors 111, 112 and 113 will vary proportionally to $\beta_{NPN}^{-1}$ (i.e., inversely proportionally to $\beta_{NPN}$). These currents supplied to the current mirror amplifiers 120, 125 are amplified by a factor dependent upon the geometry of their respective component transistors, which is a factor independent of $\beta_{NPN}$. Accordingly, the composite transistors 130, 140 are supplied base currents which are inversely proportional to $\beta_{NPN}$. The quiescent base currents of composite transistors 130, 140 are multiplied by their common-emitter forward current gains (betas) each equal to $\beta_{NPN}$, to determine their quiescent collector currents. These quiescent collector currents accordingly are substantially independent with regard to the variable $\beta_{NPN}$, with respect both to temperature variations of $\beta_{NPN}$ and to variations attributable to processing variations between different production runs.

An alternative way to apply a bias potential to the base electrode of transistor 113 so as to cause the quiescent collector currents of composite transistors 130, 140 employs the bias configuration shown in FIG. 1 of the above-cited U.S. Pat. No. 3,573,645. Bias potential is developed across the series combination of two diode-connected transistors which have similar base-emitter junction areas, each several times as large as the area of the base-emitter junctions of transistors 111, 112, 113. The "diode-connected" transistors have their base electrodes direct coupled from their collector electrodes; the effective diode cathode and anode are provided by separate ones of the collector and emitter electrodes of the transistors. This serial combination is forward biased by connection via a beta-dependent resistor; such as a pinch resistor, from a regulated potential.

Another alternative employs the bias configuration shown in FIG. 2 of the above-cited U.S. Pat. No. 3,573,645 in which the potential developed across the series combination of three diode-connected transistors is coupled via an emitter follower to the base electrode of transistor 113. The series combination is forward biased by connection via a beta-dependent resistor such as a pinch resistor from a regulated supply potential. The emitter follower is biased at a current level similar to that of the diode-connected transistors by the collector current of a transistor connected in current mirror amplifier arrangement with one of the diode-connected transistors.

A current splitter arranged as set forth in either of the previous two paragraphs to use a beta dependent resistor and to supply bias currents inversely related to beta to stacked output power amplifier stages is considered to be within the scope of the present invention and within the ambit of certain claims or portions thereof of this application.

Referring to FIG. 2, composite transistors 230, 240 are used in the stacked output stages of the amplifier. The composite transistors 230, 240 operate as equivalent PNP transistors. They each include an input PNP transistor (235 or 245) responding to base current thereto applied to supply from its collector electrode a collector current shared substantially equally by the base currents of subsequent component NPN transistors (131, 132, 133, 134 or 141, 142, 143, 144). Each of the base currents of these component NPN transistors is amplified by $\beta_{NPN}$, and the amplified currents are summed at their interconnected emitter electrodes and their inter-connected collector electrodes. The paralleled NPN transistors therefore have a total common-emitter forward current gain of $\beta_{NPN}$. Consequently, the beta of each of the composite transistors 230, 240 will be substantially $\beta_{PNP} \cdot \beta_{NPN}$, the product of the beta of the PNP preamplifier transistor (235 or 245) times the beta of its NPN component transistors.

The factor $\beta_{PNP}$ enters into the determination of the quiescent collector currents of the PNP composite transistors 230, 240 and is compensated for as hereinafter presently described. The potential across the serially connected resistors 173, 174 is equal to the regulated potential at node 168 minus the sum of the offset potentials of the transistors 275, 171, 172 and is therefore substantially constant. As was the case in the FIG. 1 amplifier, and for the same reasons, the current flowing through the resistors 173, 174 is proportional to $\beta_{NPN}{}^{-1/2}$. This current is the emitter current required to flow in transistor 275. To support such flow a base current inversely proportional to $\beta_{PNP}$—that is, proportional to $\beta_{PNP}{}^{-1}$—times as large (to good approximation) must flow through the collector electrodes of transistors 171, 172 from the base electrode of transistor 275.

The current supplied from the joined collector electrodes of transistors 171, 172 of the Darlington diode configuration 170 is, then, proportional to $\beta_{NPN}{}^{-1/2}$ $\beta_{PNP}{}^{-1}$. The application of the resultant collector-to-emitter potential of transistor 172 to the phase-splitter 110 will, as described in connection with FIG. 1, result in the collector currents of transistors 112, 113 being related to the current supplied to the joined collector electrodes of transistors 171, 172 in a ratio substantially equal to $\beta_{NPN}{}^{-1/2}$. The collector currents of transistors 112, 113 will be related to the current flow through serially connected resistors 173, 174 in a ratio substantially equal to $\beta_{PNP}{}^{-1}$ $\beta_{NPN}{}^{-1}$. These collector currents inversely proportional to $\beta_{PNP}$ $\beta_{NPN}$ are applied as base currents to the composite transistors 230, 240 which have betas which are equal to $\beta_{PNP}$ $\beta_{NPN}$. They respond with quiescent collector currents which are substantially constant and beta-independent.

An interesting aspect of the present invention is the connection of the collector electrode of the common-base amplifier transistor 113 to the effective base electrode of PNP composite transistor 240, the effective emitter electrode of which is at output signal potential. The composite PNP transistor is connected in a bootstrapped common-emitter amplifier configuration—that is, it is emitter-loaded rather than collector-loaded. The output signal potential variations are coupled through the base-emitter junction of transistor 245 to cause potential variations at its base electrode. These potential variations as coupled to the collector electrode of transistor 113 provide no adverse effects upon the phase splitter 110, the gain of a common-base amplifier being substantially unity regardless of the collector-to-emitter potential of its component transistors 113 and the common-base connection decoupling the base-emitter junction of its components transistor 113 from the collector output current.

Were the collector electrode connections of transistors 112, 113 to the base electrodes of transistors 235, 245 reversed, however, operation of the phase-splitter 110 would be impaired. The potential variations at the base electrode of transistor 245 would then be coupled to the collector electrode of transistor 112. Variation of the collector-to-emitter potential of a transistor varies its transconductance. Variation of the transconductance of transistor 112 would undesirably vary the gain of the current mirror amplifier comprising transistor 112 and the diode-connected transistor 111. The substantially unity gain desired from that current mirror amplifier configuration to complement that of the common-base amplifier transistor 113 would be departed from slightly, but measurably and undesirably.

In the circuit connected as shown in FIG. 2 the collector potential of transistor 112 does not vary appreciably with signal. The base electrode of transistor 235 is clamped to the direct potential provided by the energizing source 160 within the offset potential of its base-emitter junction, which is substantially constant.

FIG. 3 shows a power amplifier having a first output stage comprising a pair of stacked composite-PNP transistors 230, 240 and a second output stage comprising a pair of stacked composite-PNP output transistors 330, 340. These first and second output stages are arranged to be driven in anti-phase from phase splitter circuits 110 and 310, respectively, and to respond to supply anti-phase output signals at terminals 351, 352. These output signals are provided at substantially equal quiescent potentials so load 155 may be direct coupled therebetween. This type of amplifier and load configuration is known as a bridge amplifier and is favored because there is no need for direct current isolation between its component amplifiers and the load. The anti-phase signals at the terminals 351, 352 are differentially combined in a differential amplifier 360 to provide an error signal on buss 361 for application to preamplifier stage 105, which supplies signals to the phase-spllitters 110, 310. This completes an overall degenerative feedback connection. The differential amplifier 360 comprising elements 362, 363, 364, 365, 366, 367, 368 is of a type accepting large input signal potential variations without overload and without sacrifice of common mode rejection. This type of differential amplifier is described in greater detail in my concurrently filed U.S. Pat. application Ser. No. 363,630. As described in that disclosure the use of only differential-mode feedback from output terminals 351 and 352 to the preamplifier 105, as provided by differential amplifier 360, does not provide for correction of common-mode biasing errors appearing at terminals 351 and 352. The use of current-mode biasing is described as permitting the output amplifier stages 230, 240, 330, 340 to attain thermal equilibrium conditions in which these common-mode biasing errors are reduced.

Phase-splitter circuit 310 is basically a replica of phase-splitter circuit 110. The base electrodes of transistors 113, 313 respectively included in phase-splitters 110, 310 are each biased from the same bias network 370. The phase-splitter 310 differs from phase-splitter 110 in that the collector electrode of its component common-emitter amplifier transistor 312 is coupled to the bootstrapped common-emitter amplifier composite -PNP transistor 340. As hereinfore noted this can give rise to a problem of the transconductance of transistor 312 varying in response to variations in its collector current. This problem is solved by the interposition of a common-base amplifier transistor 314 to couple the collector current of transistor 312 with substantially unity current gain to the base electrode of transistor 345.

The collector potentials of transistors 311, 312 are maintained substantially equal. The base electrodes of transistors 313, 314 are at the same potential, and the offset potentials across their base-emitter junctions are substantially equal. The similarity of the collector potentials of the transistors 311, 312 of itself—as distinct from the absence of collector-to-emitter potentials variations of transistor 312—improves the determination of the gain of the current mirror amplifier they form solely as a function of their base-emitter junction areas. Accordingly, the phase splitter circuit 110 could utilize a common base amplifier transistor to couple to collector electrode of transistor 112 to the base electrode of transistor 235 with some benefit, although such connection is not shown.

The circuitry in FIG. 3 of primary interest is the biasing network 370 which in conjunction with phasesplitters 110, 310 supplies beta-dependent quiescent "base" currents to composite PNP transistors 230, 240, 330, 340. No beta-dependent resistors are used in this network. At the present time this is advantageous insofar as integrated circuitry is concerned. The absolute resistance of a beta-dependent pinch resistor is harder to control than that of a resistor formed by a single diffusion.

Resistor 371 is a beta-independent resistor, such as that formed by a single diffusion. The potential across resistor 371 is substantially constant being equal to the regulated potential appearing at node 168 minus the sum of the base-emitter potential offsets of PNP transistor 372 and of NPN transistors 373, 374, 375. This substantially constant potential impressed upon the beta-independent resistor 371 causes a substantially constant beta-independent "emitter" current in the composite PNP transistor 376. The current gain of the composite PNP transistor 376 is the product of the current gain $\beta_{PNP}$ of its component PNP transistor 372 times the current gain $\beta_{NPN}$ of its component NPN transistor 377. The "base" current of the composite PNP transistor 376 flowing to the base electrode of transistor 372 via the series combination of the diode-connected transistors 373, 374, 375 is therefore inversely proportional to this product, $\beta_{PNP}\,\beta_{NPN}$, to good approximation.

Transistors 373, 374, 375, 378, 379 have similar geometries. The diode-connected transistors 373, 374, 375 have similar base-emitter junction offset potentials to which their collector-to-emitter potentials are regulated in response to the base current of transistor 372. This regulation process causes their emitter currents substantially to equal the base current of transistor 372. The diode-connected transistor 375 forms a current mirror amplifier in conjunction with transistor 378, therefore, the emitter current of transistor 378 is substantially equal to the base current of transistor 372. So is its collector current, which is substantially equal to its emitter current and provides the predominate portion of the emitter current of transistor 379. The offset potential across the base-emitter junction of transistor 379 is therefore substantially equal to the collector-to-emitter potentials of each of the diode-connected transistors 373, 374, 375.

The potential applied to the base electrodes of transistors 113, 313 is therefore substantially equal to twice the collector-to-emitter (and base-to-emitter) potential of any of the diode-connected transistors 373, 374, 375. The potential divides equally between the base-emitter junctions of transistors 113, 111 (and 313, 311 as well). The base-to-emitter potential of each transistors 113, 111, 112 (and 313, 311, 312 as well) will then substantially equal that of the diode-connected transistors 373, 374, 375. The quiescent collector currents of the transistors 112, 113, 312, 313 consequently are a multiple of the collector current flowing in transistors 373, 374, 375, which multiple is determined by the relative base-emitter junction areas of the transistors in one of these groups to those of the other. The multiple is beta-independent and equal to unity if all of these transistors have equal base-emitter junction areas.

The quiescent collector currents of the transistors 112, 113, 312, 313 are therefore inversely proportional to the product $\beta_{PNP}\,\beta_{NPN}$. When applied as quiescent "base" currents to the composite output transistors 230, 240, 330, 340 the quiescent "collector" currents of the composite transistors will be substantially constant and beta-independent. This follows because the equivalent beta of each of the composite-PNP output transistors (230, for example) is equal to the product of the beta of its preliminary PNP transistor (235, for example), $\beta_{PNP}$, times the beta of its parallelled component NPN transistors (131, 132, 133, 134 in the example), $\beta_{NPN}$.

The parallelled diode-connected transistors 111, 311 can be replaced by a single transistor having an effective base-emitter junction area twice that of each of these transistors without affecting the operation of the circuit. The word "transistor" in the claim encompasses composite transistor devices as well as simple, single transistors.

In the embodiments of the present invention shown in FIGS. 1, 2 and 3, the means for phase-splitting signals to drive the output transistors have been included in the means used for applying beta-dependent quiescent currents to the output transistors. This is economical of parts. However, the phase-splitter circuit 110 or 310 may be passively employed without application of signal to terminal 107; and push-pull current drives may be applied to the output composite transistors 130, 140; 230, 240 or 330, 340 by other means as are known. Such circuits are within the scope of the present invention inasmuch as beta-dependent currents are applied to the output transistors to cause their quiescent collector currents to be constant irrespective of temperature and/or process variations.

What is claimed is:

1. A circuit for developing first and second, push-pull output currents responsive to an input current comprising:

first, second, third, and fourth circuit nodes, said first and said second nodes being adapted for connecting to a source of said input current, said first and said third nodes being adapted for connection to a source of bias potential;

first, second, third, fourth and fifth transistors of the same conductivity type, each having a base, an emitter and a collector electrode, and each having a forward current gain of substantially beta, the emitter electrodes of said first and said second and said fourth transistors each being direct current conductively coupled to said first node, the base electrodes of said first and said second transistors each being direct coupled from said second node, said first transistor collector electrode and said third transistor emitter electrode each being direct current conductively coupled to said second node, the collector electrodes of said fourth and said fifth transistors being direct current conductively coupled to said fourth node, said base electrodes of said third and said fifth transistors being direct coupled from said fourth node, said fourth transistor base electrode being direct coupled from said fifth transistor emitter electrode first and second resistive elements, with similar resistances but relatively beta-dependent and beta-independent, respectively, connected in series between said third and said fourth nodes; and utilization means connected to the collector electrodes of said second and said third transistors, respectively.

2. A circuit as claimed in claim 1 including:

a sixth transistor of opposite conductivity type to said fourth transistor, said sixth transistor having a collector electrode direct current conductively coupled to said first node, having an emitter electrode connected to said third node, and having a base-emitter junction included in said direct coupled series combination with said first and said second resistors, and poled for easy conduction.

3. A circuit as claimed in claim 2 having seventh and eighth transistors of the same conductivity type as said first transistor and ninth and tenth transistors of the opposite conductivity type, each having a base and an emitter and a collector electrode, said ninth transistor collector electrode being direct coupled to said seventh transistor base electrode, said tenth transistor collector electrode being direct coupled to said eighth transistor base electrode, the base electrodes of said ninth and said tenth transistors being respectively direct coupled to separate ones of the collector electrodes of said second and said third transistors, said seventh transistor emitter electrode being direct current conductively coupled to said eighth transistor collector electrode and having said tenth transistor emitter electrode direct coupled therefrom and, first and second terminals adapted for application of a source of energizing potentials, said first terminal having said eighth transistor emitter electrode and said first node direct current conductively coupled thereto, said second terminal having said seventh transistor collector electrode said ninth transistor emitter electrode and said third node direct current conductively coupled thereto.

4. An integrated-circuit quasi-linear amplifier comprising:

a first composite transistor including an input transistor and at least one output transistor of complementary conductivity type to said input transistor, said input transistor having a base electrode providing the "base" electrode of said first composite transistor, and having a collector region, each said output transistor having a base region direct coupled to said input transistor collector region, said input transistor having an emitter electrode and each said output transistor having a collector electrode, all direct current conductively coupled to the "emitter" electrode of said first composite transistor, each said output transistor having a collector electrode direct current conductively coupled to the "collector" electrode of said first composite transistor;

a second composite transistor of substantially similar composition and consequently similar operational characteristics to said first composite transistor and thereby provided with a base, an emitter and a collector electrodes;

means serially connecting the collector-to-cemitter paths of said first and said second composite transistors for application of operating potential means arranging said first and said second composite transistors in common emitter amplifier configurations, on being collector-loaded and the other being emitter-loaded;

a first phase-splitting amplifier including first and second and third transistors, each having base and an emitter and collector electrodes and being of said complementary conductivity type, said first and said second transistors being connected in grounded-emitter amplifier configuration with their base electrodes direct coupled to said third transistor emitter electrode, said first transistor collector electrode being direct current conductively coupled to said third transistor emitter electrode, the collector electrodes of said second and said third transistors being direct coupled respectively to the base electrodes of said first and said second composite transistors;

means for supplying a potential related to the common-emitter forward current gains of said first and said second composite transistor to the base electrode of said third transistor in said first phase-splitting amplifier.

5. An integrated-circuit quasi-linear amplifier as claimed in claim 4 wherein said means for supplying a related potential includes:

a Darlington configuration of transistors, having an output circuit which supplies said related potential and having an input circuit connected to its own said output circuit, and a source of current related to the common emitter forward current gains of said first and said second composite transistors, said source being coupled to said input circuit of said Darlington configuration.

6. An integrated circuit quasi-linear amplifier as claimed in claim 5 wherein said source of current comprises:

a source of fixed bias potential;

an auxiliary transistor of the same conductivity type as said input transistors connected in grounded-collector configuration having a base electrode connected to said Darlington configuration input circuit and having an emitter electrode, first and second resistors having substantially equal nominal resistance values, one being formed by the single diffusion process used to form the base regions of said vertical structure and the other a pinch type being formed by the diffusion processes used to form the base and the emitter regions of said vertical structure resistors, together connecting the emitter electrode of said auxiliary transistor to said source of fixed bias potential.

7. An integrated-circuit quasi-linear amplifier as claimed in claim 4 including:

third and fourth composite transistors similar to said first and said second composite transistors, respectively, and similarly connected with respect to each other as said first and said second composite transistor;

a second phase-splitting amplifier including fourth and fifth and sixth and seventh transistors, each having a base and an emitter and a collector electrode and being of said complementary conductivity type, said fourth and said fifth transistors being connected in grounded-emitter amplifier configuration with their base electrodes to which said fourth transistor collector electrode is direct current conductivity coupled, the base electrodes of said sixth and said seventh transistors being arranged to receive from said means for supplying a potential that potential, said fifth transistor collector electrode being direct current conductively coupled to said seventh transistor emitter electrode, the collector electrodes of said sixth and said seventh transistors being direct coupled respectively to the base electrodes of said fourth and said third composite transistors.

8. An integrated-circuit quasi-linear amplifier comprising:

first and second similar transistors, respectively arranged in emitter-loaded and collector-loaded common emitter transistor amplifiers each having an input circuit and an output circuit, said output circuits being stacked for serial application of operating potential thereto, a phase-splitting amplifier comprising third and fourth and fifth transistors of opposite conductivity type to said first and second transistors, each having a base and an emitter and a collector electrode, said phase-splitting amplifier arranged to accept input signal currents applied between the interconnection of the emitter electrodes of said third and said fourth transistors, the interconnection of said third transistor base electrode and of its collector electrode and of said fourth transistor base electrode and of said fifth transistor emitter electrode said phase-splitting amplifier being responsive to said input signal currents to provide Class B push-pull signals to separate ones of said common-emitter transistor amplifier input circuits from the collector electrodes of said fourth and said fifth transistors respectively, said phase-splitting amplifier arranged to accept a bias potential direct coupled between the base electrode of said fifth transistor and said interconnection of the emitter electrodes of said third and fourth transistors.

9. A quasi-linear amplifier as claimed in claim 8 wherein:

a sixth transistor of said opposite conductivity type has a base electrode connected in common with said fifth transistor base electrode, has an emitter electrode connected to said fourth transistor and has a collector electrode connected to said first transistor base electrode, thereby providing a common-base amplifier to implement said provision of Class B signal to said first transistor base electrode.

10. A quasi-linear amplifier as claimed in claim 8 wherein said bias potential is provided by means comprising:

a source for supplying substantially fixed potential;

a sixth transistor of the same conductivity type as said first and said second transistors, said sixth transistor having emitter and collector electrodes and an emitter-to-collector path therebetween and having a base electrode;

resistive means serially connected with said emitter-to-collector path of said sixth transistor to receive said substantially fixed potential;

a plurality of semiconductor junctions in series connection with each other between the collector and the base electrodes of said sixth transistor and poled to conduct its base current, said bias potential being developed across said series connection responsive to said sixth transistor base current.

11. In an integrated circuit amplifier employing a transistor with base, emitter and collector electrodes, an improved circuit for supplying base current to the transistor to condition its collector current to be substantially independent of its common-emitter forward gain, equal to beta, comprising:

impedance means formed concurrently with said transistor within said integrated circuit amplifier by common processing steps and having a resistance which varies substantially proportionally to the square root of said beta;

voltage source means applying a substantially constant potential across said impedance means for developing a current flow through said impedance means substantially inversely proportional to the square root of said beta;

current amplifier means having an input circuit included within said impedance means for sensing the current flow through said impedance means, having an output circuit for supplying an output current to the base electrode of said transistor, and having a current gain substantially inversely proportional to the square root of the beta of said transistor.

12. An improved circuit as set forth in claim 11 wherein said impedance means comprises a serial connection of a pinch resistor, formed by the same diffusion processes as the base and emitter regions of the transistor and thus having a beta-dependent resistance, and another resistive means, this one having a relatively beta-independent resistance compared to that of said pinch resistor.

13. An amplifier comprising in combination:

first and second transistors of the same conductivity type, each having emitter and collector electrodes, with an emitter-to-collector path therebetween, each having a base electrode and both having the same common-emitter forward current gain, equal to beta;

signal source means for supplying first and second input signal currents respectively to said first transistor base electrode and to said second transistor base electrode, said source means supplying said first and said second input signal currents at relatively high impedance levels compared to the impedances presented by the base electrodes of said first and said second transistors during their conduction;

resistive means formed concurrently with said first and second transistors by the same manufacturing process, and thermally coupled to said first and said second transistors to sense their temperatures, whereby the resistance of said resistive means varies as does a positive power of said beta;

voltage source means applying a potential across said resistive means to cause a current flow therethrough;

means for sensing the current flow through said resistive means and for responding to supply at relatively high impedance level to that first transistor base electrode a first quiescent bias current, which varies inversely as does said beta;

means for sensing the current flow through said resistive means and for responding to supply at relatively high impedance level to said second transistor base electrode a second quiescent bias current, which varies inversely as does said beta and is substantially equal to said first quiescent current;

means for applying operating potentials to the emitter-to-collector paths of each of said first and second transistors; and means for coupling the emitter-to-collector paths to provide a push-pull output signal current in response to said first and said second input signal currents.

14. An amplifier as set forth in claim 13 wherein said resistive means has a resistance proportional to the square root of said beta.

15. An amplifier as set forth in claim 14 wherein said resistive means comprises a serial connection of a pinch resistor and another resistor.

16. A quasi-linear amplifier comprising in combination:

first and second terminals for connection of an operating potential therebetween;

a third terminal for receiving an input signal;

a fourth terminal for connection to an output load;

first and second transistors of the same conductivity type, each having base and emitter and collector electrodes and having a common-emitter forward current gain, equal to beta, said first transistor collector electrode being connected to said first terminal, said first transistor emitter electrode and said second transistor collector electrode each being connected to said fourth terminal, said second transistor emitter electrode being connected to said second terminal;

first signal rectifying means connected to respond to positive swings of said input signal at said third terminal for providing a first Class B signal current;

second signal rectifying means connected to respond to negative swings of said input signal at said third terminal for providing a second Class B signal current;

means applying the first and second Class B signal currents from said first and said second rectifying means, respectively, to respective separate ones of the base electrodes of said first and said second transistors;

means for supplying to the base electrode of said first transistor a first quiescent bias current varying as a function of temperature and transistor manufacturing process inversely as said beta varies and being relatively small compared to the maximum amplitude of said first Class B signal; and means for supplying to the base electrode of said second transistor a second quiescent bias current, varying as a function of temperature and transistor manufacturing processes inversely as said beta varies, being relatively small compared to the maximum amplitude of said second Class B signal and being of substantially the same value as said first quiescent base current.

17. An amplifier as set forth in claim 16 wherein said means for supplying a first quiescent bias current comprises:

impedance means formed concurrently with said first transistor by common processing steps and having a resistance, which resistance is a function of temperature and processing such as to be proportional to the square root of said beta;

voltage source means applying a substantially constant potential across said impedance means for developing a current flowing through said impedance means inversely proportional to the square root of said beta; and current amplifier means having an input circuit included within said impedance means for sensing the current flow through said impedance means, having an output circuit for providing said first quiescent bias current, and having a current gain substantially inversely proportional to the square root of said beta.

18. An amplifier as set forth in claim 16 wherein said means for supplying a second quiescent bias current comprises:

impedance means formed concurrently with said second transistor by common processing steps and having a resistance, which resistance is a function of temperature and processing such as to be proportional to the square root of said beta;

voltage source means applying a substantially constant potential across said impedance means for developing a current flow through said impedance means inversely proportional to the square root of said beta; and current amplifier means having an input circuit included within said impedance means for sensing the current flow through said impedance means, having an output circuit for providing said second quiescent bias current and having a current gain substantially inversely proportional to the square root of said beta.

* * * * *